(12) United States Patent
Alam et al.

(10) Patent No.: US 10,380,298 B2
(45) Date of Patent: *Aug. 13, 2019

(54) VALIDATION OF CIRCUIT DEFINITIONS

(71) Applicant: Mentor Graphics Corporation, Wilsonville, OR (US)

(72) Inventors: Michael Alam, Ottawa (CA); Peter Campbell, Ottawa (CA); Mark Cianfaglione, Ottawa (CA)

(73) Assignee: Mentor Graphics Corporation, Wilsonville, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 14/160,859

(22) Filed: Jan. 22, 2014

(65) Prior Publication Data

US 2014/0137058 A1 May 15, 2014

Related U.S. Application Data

(63) Continuation of application No. 13/588,975, filed on Aug. 17, 2012, now Pat. No. 8,650,515.

(60) Provisional application No. 61/524,985, filed on Aug. 18, 2011.

(51) Int. Cl.
*G06F 17/50* (2006.01)

(52) U.S. Cl.
CPC ...... *G06F 17/5045* (2013.01); *G06F 17/5022* (2013.01)

(58) Field of Classification Search
CPC .. G06F 17/5009; G06F 17/50; G06F 17/5068; G06F 17/5045; G06F 17/5022

USPC ................................................. 716/100–107
See application file for complete search history.

(56) References Cited

U.S. PATENT DOCUMENTS

| | | | |
|---|---|---|---|
| 6,230,305 B1* | 5/2001 | Meares | 716/102 |
| 6,360,353 B1 | 3/2002 | Pember et al. | |
| 6,711,730 B2* | 3/2004 | Frank | G06F 17/5068 716/113 |
| 6,851,094 B1 | 2/2005 | Robertson et al. | |
| 6,877,033 B1 | 4/2005 | Garrett et al. | |
| 7,143,023 B2 | 11/2006 | Katz et al. | |
| 7,228,514 B2 | 6/2007 | Chan et al. | |
| 8,666,720 B2* | 3/2014 | Chang et al. | 703/13 |
| 2006/0271899 A1* | 11/2006 | Tan | G06F 17/5068 716/113 |
| 2008/0244484 A1* | 10/2008 | Kumazaki | G06F 17/5022 716/106 |
| 2011/0153305 A1 | 6/2011 | Chang et al. | |
| 2011/0214097 A1* | 9/2011 | Nodine | G06F 17/504 716/107 |

OTHER PUBLICATIONS

BQR Realiability Engineering, "fiXtress", Dec. 8, 2009; 2 pages.
(Continued)

*Primary Examiner* — Nghia M Doan
(74) *Attorney, Agent, or Firm* — Mentor Graphics Corporation

(57) ABSTRACT

Systems and methods for validating a circuit design are described. The circuit validation includes determining a subset of checks to apply to a portion of the overall circuit based on the pin type composition of the circuit portion.

31 Claims, 10 Drawing Sheets

(56) References Cited

OTHER PUBLICATIONS

Coresim, "Technology", Apr. 11, 2008; 1 page.
Coresim, "Products & Services", Apr. 11, 2008; 1 page.
Coresim, "Advanced Design Analysis for New Board designs", Apr. 11, 2008; 6 pages.
Coresim, "Requirements for Schematic Modeling Quotation", Apr. 11, 2008; 1 page.

* cited by examiner

VALIDATION OF CIRCUIT DEFINITIONS

CROSS-REFERENCE TO RELATED APPLICATIONS

This application is a Continuation of application Ser. No. 13/588,975 filed Aug. 17, 2012, which claims priority to U.S. Provisional Application Ser. No. 61/524,985 Filed Aug. 18, 2011, the entire contents of which are incorporated herein by reference.

TECHNICAL FIELD

The current disclosure relates to systems and methods for validating circuits, and in particular to systems and methods for validating connections of components of circuits based on a description of the circuit.

BACKGROUND

A circuit is an electrical network of components. A circuit may include complex digital circuits comprising tens, hundreds, thousands or more of interconnected components. The components of circuits may comprise a single discrete component such as a resistor, capacitor, inductor, diode, transistor etc. The components may also include other circuits providing more complex components such as an operational amplifier, a voltage regulator, a shift register, an arithmetic logic unit, a microcontroller, a microprocessor, etc. Complex functionality can be provided by connecting a plurality of components together in various manners.

The specific connections of components for a circuit may be defined in numerous fashions. One such definition is called a netlist which specifies a plurality of nets, each of which indicates components, or more particularly ports, or pins, of components, that are connected together. Each component specified in a net may be identified by a reference, and the specific component associated with the reference can be specified separately, typically in a Bill of Materials (BOM).

A typical process for manufacturing complex circuits includes designing the circuit using software, testing the design of the circuit, including functional and timing tests, to ensure it functions as desired. Once the circuit is designed, a physical implementation of the design is created and the circuit can be manufactured in accordance with the created physical design. It can be costly to create the physical implementation and as such, it is desirable to have as few errors as possible in the circuit design prior to creating the physical implementation.

Various techniques exist for testing a circuit during the design stage. These include timing simulations and functional analysis. The techniques may further include logical equivalence checking, which compares a model of the circuit being designed to a golden reference model which describes the desired functionality of the circuit. Although these techniques are useful, they may not identify problems in the design such as mismatched driver and input levels, short-circuits, and other problems. Basic checks for these types of problems may be implemented, but have not been applied to check all components and connections of a circuit being designed, as the time required to apply all of the tests to all of the connections and components make the application infeasible.

It is desirable to have a system and method for validating a circuit design in order to identify potential problems with the design.

BRIEF DESCRIPTION OF THE DRAWINGS

Embodiments are described herein with references to the appended drawings, in which.

DETAILED DESCRIPTION

Figure 1:
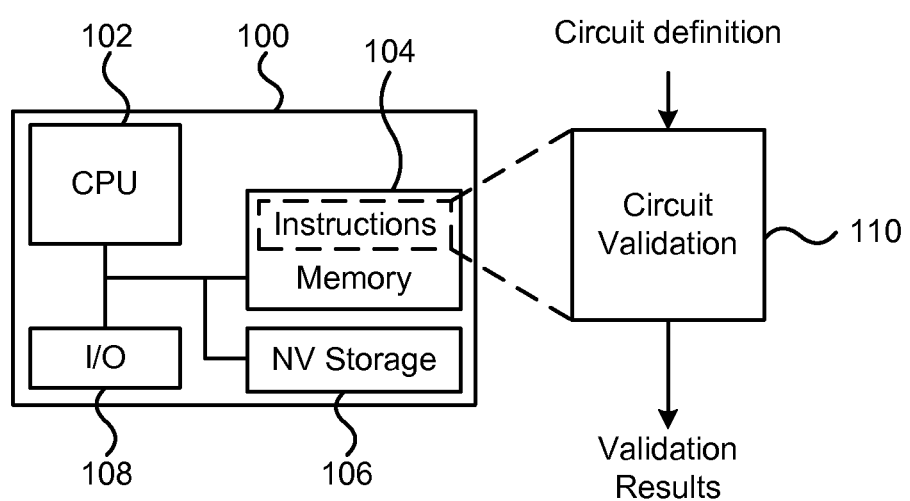
FIG. 1 depicts in a block diagram a system for validating a circuit definition.

In accordance with the present disclosure there is provided a method for use in validating a circuit design, the method comprising accessing circuit information specifying a plurality of connections between a plurality of components of at least a portion of the circuit design; retrieving from a plurality of parametric models a respective parametric model for each of the plurality of components specified in the received circuit information, each of the parametric models specifying a pin type, from a plurality of pin types, and operating parameters of each pin of the associated component; determining a plurality of checks to apply to at least the portion of the circuit design based on the pin types of the plurality of components; and applying the plurality of determined checks to at least the portion of the circuit definition.

In accordance with the present disclosure there is further provided a system for validating a circuit design comprising: a processor for executing instructions; and a memory for storing instructions, the instructions when executed by the processor configuring the system to: access circuit information specifying a plurality of connections between a plurality of components of at least a portion of the circuit design; retrieve from a plurality of parametric models a respective parametric model for each of the plurality of components specified in the received circuit information, each of the parametric models specifying a pin type, from a plurality of pin types, and operating parameters of each pin of the associated component; determine a plurality of checks to apply to at least the portion of the circuit design based on the pin types of the plurality of components; and apply the plurality of determined checks to at least the portion of the circuit definition.

In accordance with the present disclosure there is further provided a non-transitory computer readable memory containing instructions for carrying out a method for use in validating a circuit design, the method comprising: accessing circuit information specifying a plurality of connections between a plurality of components of at least a portion of the circuit design; retrieving from a plurality of parametric models a respective parametric model for each of the plurality of components specified in the received circuit information, each of the parametric models specifying a pin type, from a plurality of pin types, and operating parameters of each pin of the associated component; determining a plurality of checks to apply to at least the portion of the circuit design based on the pin types of the plurality of components; and applying the plurality of determined checks to at least the portion of the circuit definition.

Current circuit design comprises connecting a plurality of components together. Components may be active components or passive components. Each active component used in electronic designs has several electrical parameters which must be observed to ensure that safety and proper operation can be achieved. Failure to take these parameters into consideration can cause both hard and/or intermittent failures which can be very difficult to diagnose. In a simple circuit involving few components, it may be a simple process to debug as there are very few connections to analyze. However circuit designs may be large and extremely complex with thousands of components and thousands of interconnections, each possibly having several pins connected to it. As circuit designs become more complex the likelihood of errors being introduced in the design phase increases rapidly. Systems and methods for accurately checking the electrical suitability of two or more connected pins of components in a circuit design are described further herein. The systems and methods allows for validating the circuit board design of large circuit boards comprising hundred, thousands or more components and associated interconnections.

FIG. 1 depicts in a block diagram a system for validating a circuit board definition. The system 100 comprises a processor 102, which may be provided by a central processing unit (CPU), and memory 104 connected to the processor 102. The memory 104 may comprise random access memory (RAM) or other types of memory and may be provided separately from the processor 102, as part of the processor 102, or a combination thereof. The system 100 may further comprise non volatile storage 106 for providing storage when the system 100 is powered off. The system 100 may further comprise an input/output (I/O) interface 108 for connecting other devices or components to the processor 102. For example, a display and keyboard may be connected to the system 100.

The memory 104 stores instructions, that when executed by the processor configure the system to provide circuit validation functionality no as described further herein. The circuit board validation functionality no receives a definition of a circuit board to be validated and processes the circuit definition in order to identify problems, or potential problems in the circuit definition. The circuit validation functionality no may then provide the validation results comprising the identified problems or potential problems for presentation to a user. The validation results can be used to improve the design of the circuit board.

The circuit validation functionality no uses parametric models of components present in the circuit definition to determine a subset of checks to apply to the different components and connections. The parametric models of the components may represent the components as a set of pins, each having a specific pin type and one or more parameters, such as maximum and minimum voltages, power ratings, or other parameters that may describe operating limitations or requirements of the components. Applying only a subset of available checks to the circuit design allows the circuit design to be validated quickly, while still ensuring appropriate checks have been applied to the circuit or portions of the circuit in order to identify a portion of, if not all of, the problems or potential problems with the circuit design. Further, by applying only a subset of available checks to the circuit design may simplify the results as opposed to presenting the results of checks applied to pins which may not provide any meaningful information.

Figure 2:
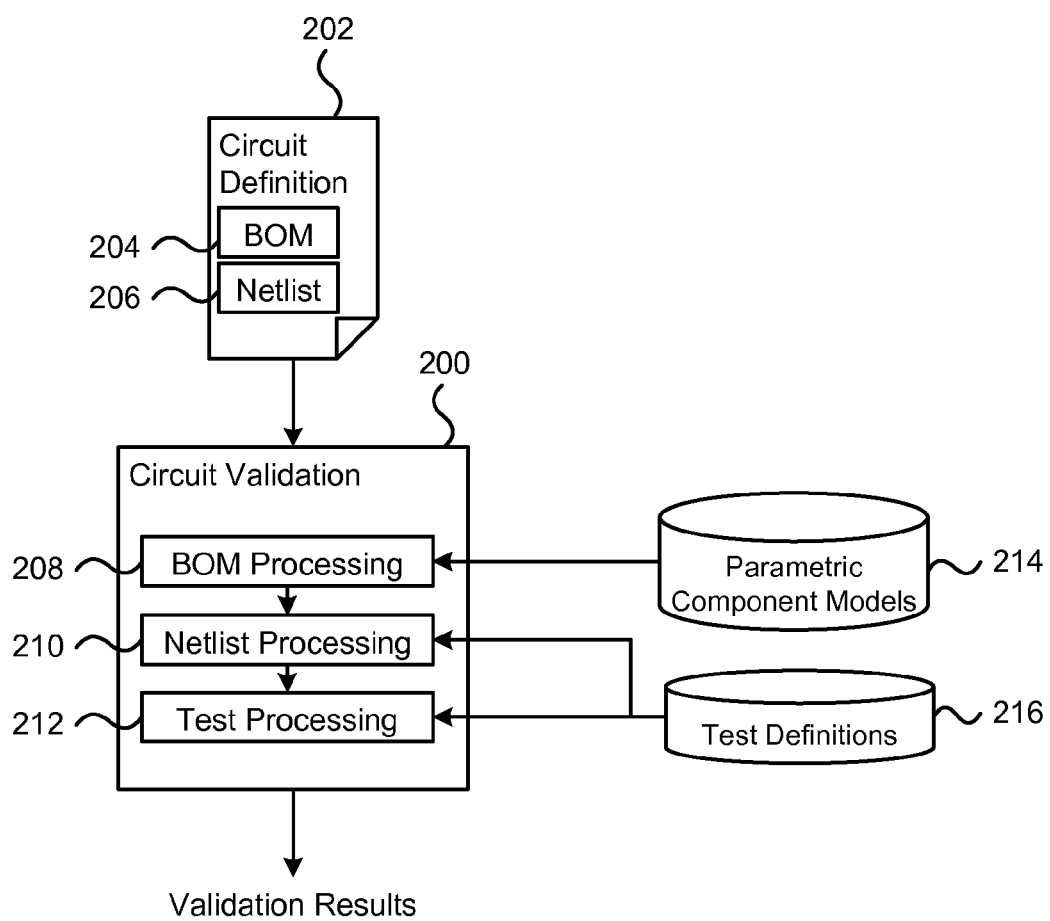
FIG. 2 depicts in a block diagram logical component of circuit validation functionality.

FIG. 2 depicts in a block diagram logical component of circuit validation functionality. The circuit validation functionality 200 may provide the circuit validation functionality no as described above with reference to FIG. 1. The circuit validation functionality 200 may receive a circuit definition 202. The circuit definition 202 fully describes a circuit board to be validated. The circuit definition 202 may be provided in various ways including through a Bill of Materials (BOM) 204 and a netlist 206 as depicted. The BOM 204 associates a specific component with a component reference. The netlist 206 specifies the specific connections between components using the component references of the BOM. For example, the netlist may specify that a component reference, U1, has its first pin connected to a first end of a resistor, R. The BOM may in turn specify the actual component associated with the component reference U1, for example using a manufacturer's part number or other identifying means, as well as the specific resistor value for R. The combination of the BOM 204 and the netlist 206 specify what all of the different components of a circuit are and how they are connected together. The netlist 206 may specify the connection as a plurality of nets. Each net specifies the component references, or more particularly pins of referenced components, that are connected together.

The circuit validation functionality 200 receives the circuit definition 202 and processes it in order to provide the validation results. As depicted, the circuit validation functionality 200, may comprise BOM processing functionality 208, netlist processing functionality 210 and test processing functionality 210. The functionality is described separately for the clarity of the description; however, it is contemplated that the various functionality may be combined together in various ways.

The BOM processing functionality 208 processes the BOM 204 in order to retrieve parametric models of each of the components in the circuit. The parametric models may be retrieved from a database or similar structure 214 that stores a plurality of parametric models for components that may be encountered in circuit designs. A parametric model is associated with a particular component, for example using a manufacturer's part number or other identifier used in the BOM to identify the specific component. Table 1 depicts an illustrative table that is representative of a possible parametric model that may be used to describe most components for the purpose of validating circuit design as described herein.

TABLE 1

Illustrative Parametric Model

| Pin # | Pin Name | Pin Type | Input | | | | Output | | | | Driver Qualifier | Driver Power Rail | Power | |
|---|---|---|---|---|---|---|---|---|---|---|---|---|---|---|
| | | | $V_{in}$ Max | $V_{in}$ High | $V_{in}$ Low | $V_{in}$ Min | $V_{out}$ Max | $V_{out}$ High | $V_{out}$ Low | $V_{out}$ Min | | | $V_{min}$ | $V_{max}$ |

As depicted in Table 1, each parametric model specifies an optional pin name and pin type for each pin of the component. For example, a component may have a power pin, a ground pin, and an output pin. The pin type may be used to determine which column of data to retrieve the pin's parametric data from. For example, if the pin is an input pin, the parametric data would be retrieved from the Input columns providing a value for the maximum and minimum voltages as well as the voltages used to represent high and low logic levels. The operating parameters that may be included in the parametric model may include, for example, maximum and minimum voltages for inputs (VinMax, Vin-Min) and outputs (VoutMax, VoutMin), voltages guaranteed to represent logic levels for inputs (Vih, Vil) and outputs (Voh, Vol) and minimum and maximum supply voltages (Vmax, Vmin). Not all pins will have values associated with all parameters. In various components a particular pin may have a number of particular operating parameters one of which may be selected based on an operating characteristic at another pin. For example, an output pin may output either 2.5 volts or 1 volt depending on if the supply voltage is 5 volts or 3.3 volts. The parametric models may specify the various possible operating characteristic for a pin as well as a selection characteristic used to select which operating parameters to apply. The selection characteristic may specify an associated pin and characteristic value used in selecting which of the pin definitions apply.

Numerous different pin types are possible. As described above, the pin types are used to describe the functionality of a pin of a component. Including additional pin types may allow finer control of the tests applied to the different nets; however, it may require additional modeling of a component to provide the additional information. The pin types may be grouped or described in various ways; however the following is a list of possible different pin types that may provide a good balance between the modeling complexity and the fine control of the tests to apply. The different pin types used may include one or more of: an address input, an address output, an address bi-directional, a bi-directional, an input, an output, a data bus, a positive differential bi-directional, a negative differential bi-directional, a positive differential input, a negative differential input, a positive differential output, a negative differential output, gate with internal input, bi-directional open collector, output only open collector, bi-directional open drain, gate with internal open drain, output only open drain, power, power supply output ground, fixed voltage output, ground, reference voltage, no connect, resistor with mate pin, inductor, non-polarized capacitor, positive polarized capacitor, negative polarized capacitor, analogue input, analogue, analogue output, analogue switch device.

Once the BOM processing has retrieved the parametric models of the components in the circuit, the netlist processing functionality 210 determines a plurality of checks to apply to the circuit definition. The checks to apply may be selected from a plurality of possible checks. All possible checks may be arranged in a hierarchical test tree. The netlist processing functionality 210 may process each net in the netlist in order to determine appropriate checks to apply to the particular net. If the checks are arranged in a test tree, the checks to apply may be specified by indicating a node or nodes in the test tree to begin testing from. Each pin type may be associated with one or more checks to apply to a net having that pin type. Further, each pin type may specify one or more checks as a node in the test tree. Further, the result of a check in the test tree may determine further checks to apply. In addition to determine the checks to apply based on the individual pin types, the checks to apply may also be based on the different pin types present on a net.

An individual net specified in the netlist identifies all component pins that are connected together. In certain cases, it is desirable to include other nets when considering the validation checks. For example, an output pin of one component may be connected to an input pin of another component by a resistor. Although the input and output pins are in separate nets, it is desirable to check that their operating parameters match. As such, individual nets may be combined with other nets to form an extended net. The netlist processing may include generating an extended net. The extended net comprises two or more nets connected together by a passive component such as a gate, resistor, capacitor, inductor or fuse. An extended net may be considered as being equivalent to a net when the net is not connected to any other nets by a passive component. The determination of the checks to apply to a net or extended net, or where in the test tree to begin testing from, may be based on the pin types of the components included in the extended net. For example, if all of the pin types of the extended net are either Power types or Ground types, checks may be selected that are appropriate for a power rail. However, if the extended net includes Power, Ground and Input pins, checks may be selected that are appropriate for a power rail as well as checks to ensure that the operating characteristics of the Input type pins match the operating characteristics of the Power and Ground type pins. The appropriate checks to apply may be selected from a plurality of checks defined in a check database 216. Other means of specifying which checks to apply to a net may be defined in other ways as well. For example, the checks to apply could be hard-coded into an application using select case function, or may use files or tables to specify the checks to apply. The checks may be arranged in a hierarchical test tree, with each sub-tree specifying additional checks that may be applied to the net or extended net. Whether or not to apply checks of a sub-tree may be based on the result of the check at the root of the sub-tree. It is contemplated that the checks may be arranged explicitly in a hierarchical test tree, or alternatively, the test tree may be implicitly provided by the functionality for selecting which checks to apply.

Once the appropriate checks are determined they are applied using check processing functionality 212. The netlist processing functionality may specify one or more nodes in a test tree to begin the check processing at. The check processing functionality begins applying the checks and applies checks of sub-trees in the test tree as appropriate. The check processing functionality 212 may include selecting the appropriate operating characteristics from a component's parametric model to use for a pin. As described above, a pin may be associated with a plurality of operating parameters, each associated with a selection parameter. The check processing functionality may evaluate the circuit board design to determine which of the selection parameters is most closely satisfied by the circuit and select the appropriate operating parameters of the pin accordingly.

The check processing functionality may determine the severity of an identified problem or potential problem. As a trivial example, providing a voltage of 5.1 volts to an input pin having a maximum input voltage of 5 volts may not be as severe as providing 5 volts to an input pin having a maximum input voltage of 3.3 volts. The severity of the identified problem or potential problem may be determined based on several factors including, the specific circuit implementation, percentage delta, signal to noise ratio, loading on a particular net, etc. Once the appropriate checks, as determined by the netlist processing functionality 210, have been applied to the appropriate nets, the validation results may be presented in order to allow a user to see the identified problems or potential problems. It will be appreciated that the validation results may be provided in numerous ways.

Figure 3:
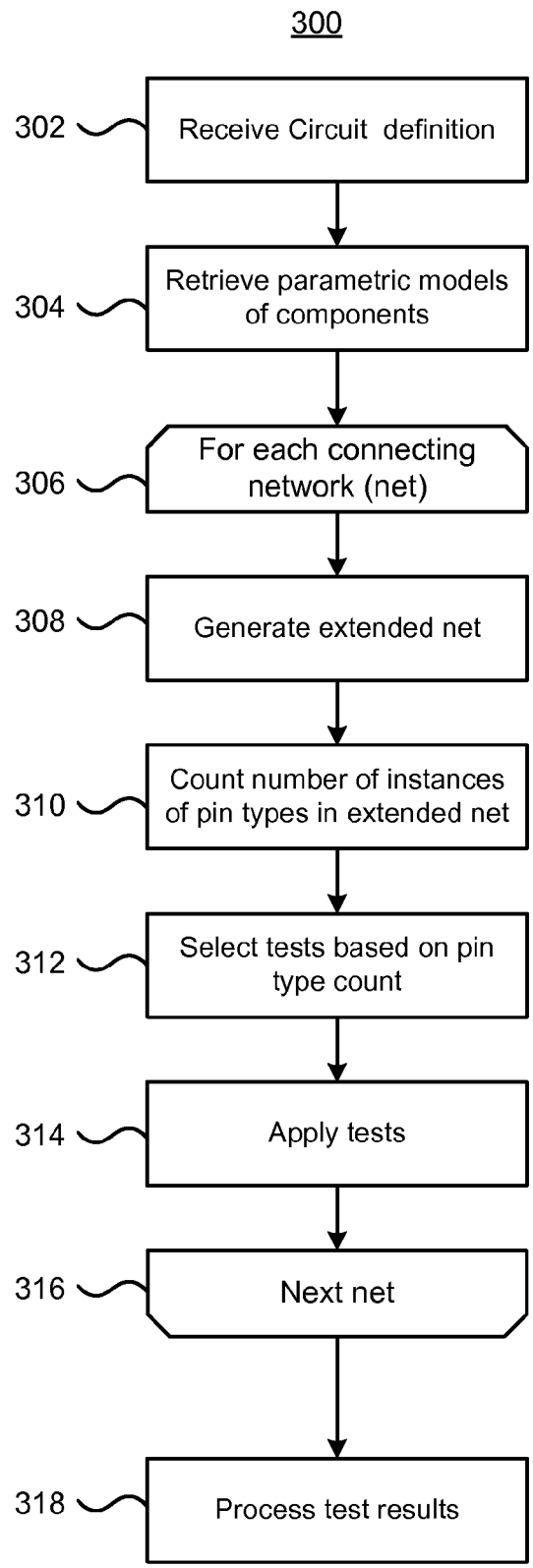
FIG. 3 depicts in a flow chart a method of validating a circuit definition.

Although the above has described retrieving the parametric models of all of the circuit components prior to processing the individual nets, the parametric models could be retrieved during the processing of the nets, or as required FIG. 3 depicts in a flow chart a method of validating a circuit definition. The method 300, comprises receiving a circuit definition (302), which defines specific components present in the circuit as well as the specific interconnection of the components or component references. Each of the specific components may be associated with a respective parametric model. Once the circuit definition is received, the parametric models associated with the various components present in the circuit are retrieved (304). The method processes each connecting network of the circuit. The connecting networks specify how the components are connected together. As described above, the connecting networks may be specified as a plurality of nets listing the component references and pins connected together. For each net (306) the method attempts to generate an extended net (308). The extended net can be generated by determining if any of the component references of the net are a passive component such as a gate, resistor, capacitor, inductor or fuse, and if they are, the net connected to the other end of the passive component is included in the net. If no passive components are connected to the net, the extended net is equivalent to the net. Once the extended net is generated, the number of instances of the different pin types present in the extended net are counted (310) using the parametric models of the components. Appropriate checks are selected based on the number of pin types present in the extended net (312). The checks may be selected from a plurality of possible predefined checks. Each of the possible predefined checks may be associated with one or more bins, which may in turn be associated with the pin types present in the extended net. The test bins may be associated with the actual number of pin types, relative number of pin types, or other conditions based on the number of pin types present in the extended net. Alternatively the checks may be defined as a hierarchical test tree and the pin type composition may be used to determine a node or nodes in the test tree to begin testing at. Once the checks are selected, they are applied (314). Applying the checks may involve determining operating characteristics to use for a particular pin if a number of operating characteristics are possible for the pin. Once the checks are completed, the next net is retrieved and processed (314). Once all of the nets have been processed, the individual results may be processed (318) in order to present the test results in a human readable output.

Figure 4:
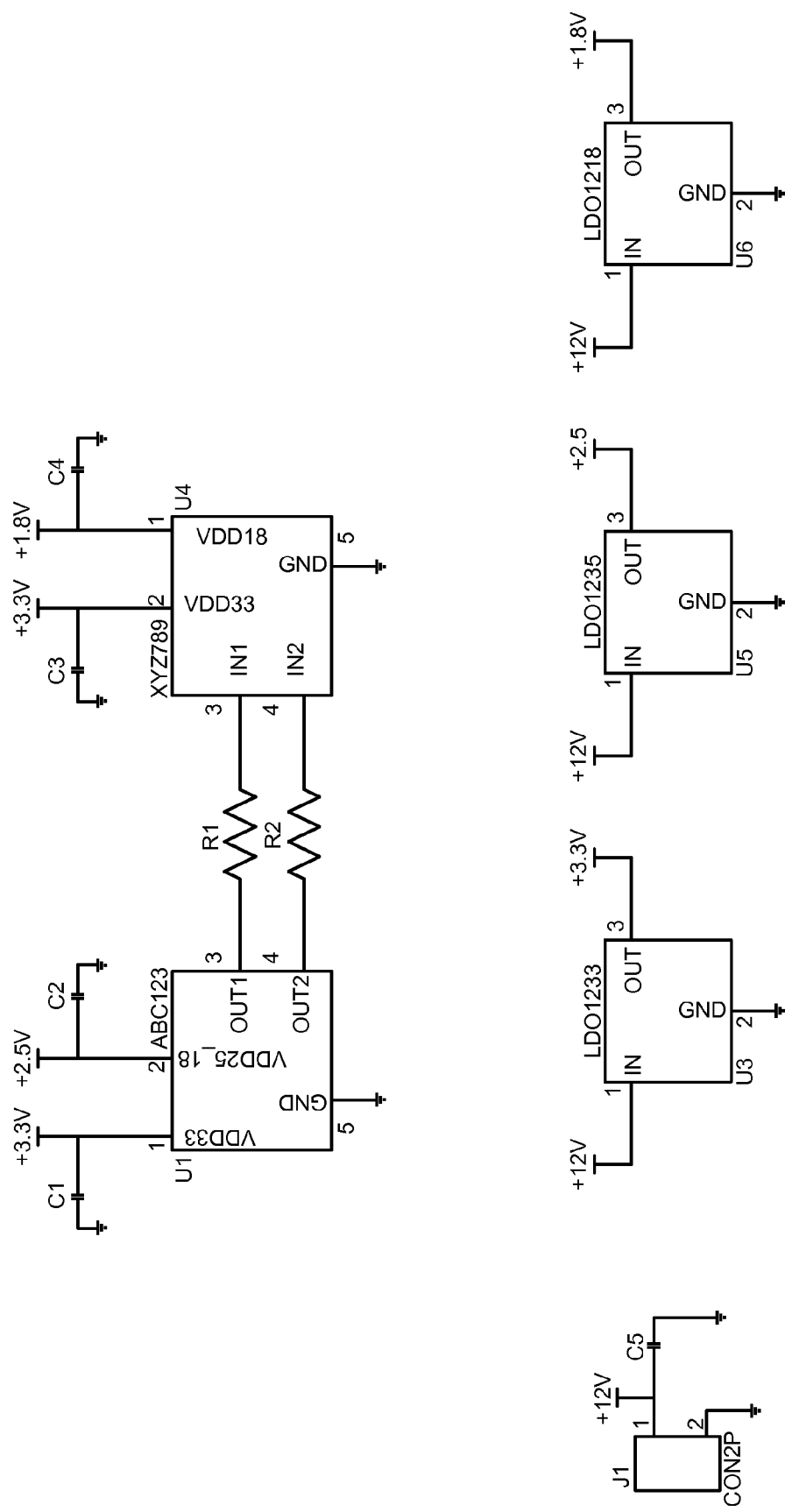
FIG. 4 depicts a schematic of an illustrative circuit.

The operation of the system and method of validating circuits will be further described with reference to a simple circuit depicted in FIG. 4. The circuit of FIG. 4 is a simple circuit, and could be validated visually since there are so few components and connections. However, the operation described can be applied to complex circuits which cannot be easily validated due to the large number of components and connections.

The electronic components depicted in FIG. 4 show connections between component pins on "U1" to "R1" and "R2" and from "R1" and "R2" to pins on component "U4" as well as connections from pins on "U1" and "U4" to "U3", "U5", and "U6". Components "J1" and "Cx" where "x" is an integer number are included for the purpose of illustration only and are not involved in the explanation herein.

The following is a netlist of the schematic of FIG. 4. The netlist comprises a plurality of referenced nets, 'unnamed_net4', "unnamed_net3', 'unnamed_net2', etc and the pins of components connected to the net. Each connected pin of a component is indicated by the component name followed by the pin number of the component separated by a hyphen, that is <Component Reference>-,<Pin Number>.

| | |
|---|---|
| unnamed_net4 | U1-4 R2-1 |
| unnamed_net3 | U4-4 R2-2 |
| unnamed_net2 | U1-3 R1-1 |
| unnamed_net | U4-3 R1-2 |
| +12 V | U6-1 U5-1 U3-1 J1-1 C5-1 |
| +1.8 V | U6-3 U4-1 C4-1 |
| +3.3 V | U3-3 U4-2 C3-2 U1-1 C1-2 |
| GND | U1-5 U6-2 U5-2 U3-2 J1-2 U4-5 C5-2 C4-2 C3-1 C1-1 C2-2 |
| +2.5 V | U5-3 U1-2 C2-1 |

The circuit definition also includes a bill of material specifying a particular component for each component referenced in the netlist. The BOM for the schematic of FIG. 4 is depicted in table 2. It is noted that the components are fictional components.

TABLE 2

Example Bill of Materials for Schematic of FIG. 4

| Manufacturer Part Number | Reference Designator |
|---|---|
| ABC123 | U1 |
| XYZ789 | U4 |
| LDO1233 | U3 |
| LDO1225 | U5 |
| LDO1218 | U6 |
| CON2P | J1 |
| ECAP | C5 |
| CAP | C1, C2, C3, C4 |
| RES | R1, R2 |

Using the BOM to indicate the manufacturer's part number, organized parametric models of the unique components used in the design may be created or retrieved from a database or repository. As described above, these parametric models specify operating parameters of each component in a known format. Within a component there are a plurality pins and each pin potentially has a unique function and characteristics. The examples shown in Table 3 through to Table 8 demonstrate the basic requirements of the parametric models for the different components of the schematic of FIG. 4. The parameters for these models may acquired by retrieving the information from the component manufacturer's datasheets for each component. This model creation process standardizes the format of the information as each manufacturer does not present its data in an industry standardized format. It will be appreciated that the information could be stored in various formats if it is possible to obtain the required values from the format. For example, an adapter component could be used for retrieving the parametric data from a manufacture's information without requiring the data be stored in a common parametric model.

TABLE 3

Parametric model for example component ABC123

| | | | Input | | | Output | | | | Driver | | Power | |
|---|---|---|---|---|---|---|---|---|---|---|---|---|---|
| Pin # | Pin Name | Pin Type | $V_{in}$ Max | $V_{in}$ High | $V_{in}$ Low | $V_{in}$ Min | $V_{out}$ Max | $V_{out}$ High | $V_{out}$ Low | $V_{out}$ Min | Driver Qualifier | Power Rail | $V_{min}$ | $V_{max}$ |
| 1 | VDD33 | PWR | | | | | | | | | | | 3.399 | 3.201 |
| 2 | VDD25_18 | PWR | | | | | | | | | | | 2.575 | 1.625 |
| 3 | OUT1 | OUT | | | | | VDD33 | 2 | 0.4 | 0 | | | | |
| 4 | OUT2 | OUT | | | | | VDD25_18 | 1.35 | 0.4 | 0 | 1.8 V | VDD25_18 | | |
| 4 | OUT2 | OUT | | | | | VDD25_18 | 2 | 0.4 | 0 | 2.5 V | VDD25_18 | | |
| 5 | GND | GND | | | | | | | | | | | 0 | |

TABLE 4

Parametric model for example component XYZ789

| | | | Input | | | | Output | | | | Driver | | Power | |
|---|---|---|---|---|---|---|---|---|---|---|---|---|---|---|
| Pin # | Pin Name | Pin Type | $V_{in}$ Max | $V_{in}$ High | $V_{in}$ Low | $V_{in}$ Min | $V_{out}$ Max | $V_{out}$ High | $V_{out}$ Low | $V_{out}$ Min | Driver Qualifier | Power Rail | $V_{min}$ | $V_{max}$ |
| 1 | VDD18 | PWR | | | | | | | | | | | 3.399 | 3.201 |
| 2 | VDD33 | PWR | | | | | | | | | | | 2.575 | 2.425 |
| 3 | IN1 | IN | VDD33 | | | 0 | | | | | | | | |
| 4 | IN2 | IN | 0.7 * VDD18 | 0.3 * VDD18 | | 0 | | | | | | | | |
| 5 | GND | GND | | | | | | | | | | | 0 | |

TABLE 5

Parametric model for example component LDO1233

| | | | Power | |
|---|---|---|---|---|
| Pin # | Pin Name | Pin Type | $V_{max}$ | $V_{min}$ |
| 1 | VIN | PWR | 15 | 12 |
| 2 | GND | GND | 0 | |
| 3 | VOUT | PWROUT | 3.399 | 3.201 |

TABLE 6

Parametric model for example component LDO1225

| | | | Power | |
|---|---|---|---|---|
| Pin # | Pin Name | Pin Type | $V_{max}$ | $V_{min}$ |
| 1 | VIN | PWR | 15 | 12 |
| 2 | GND | GND | 0 | |
| 3 | VOUT | PWROUT | 2.575 | 2.425 |

TABLE 7

Parametric model for example component LDO1218

| | | | Power | |
|---|---|---|---|---|
| Pin # | Pin Name | Pin Type | $V_{max}$ | $V_{min}$ |
| 1 | VIN | PWR | 15 | 12 |
| 2 | GND | GND | 0 | |
| 3 | VOUT | PWROUT | 1.854 | 1.746 |

TABLE 8

Pin Mate Properties for Component R1 and R2

| Pin # | Mating Pin # |
|---|---|
| 1 | 2 |
| 2 | 1 |

The above depicts representing the parametric models as tables, however it is contemplated that the parametric models may be represented or stored as other data structures. For example, the parametric models of a component could be stored as groups of name:value pairs for each of the model parameters and associated values. For example, component LDO1218 could be represented by the name:value pairs: {pinNumber:1; PinName:VIN; PinType:PWR; Vmax:15; Vmin:12}, {pinNumber:2; PinName:GND; PinType:GND; Vmax:0}, {pinNumber:3; PinName:VOUT; PinType:PWROUT; Vmax:1.854; Vmin:1.746}.

As depicted in the above tables, not all components have values for all parameters. For example, an output type pin does not have max and min input voltages. Further, passive components may include the mating pin number specifying the other end of a two pin device such as a resistor, capacitor, fuse etc. Although a single model can be constructed that includes all possible parameters that a component may have, it is not necessary to store parameter information that is not relevant for a particular component.

The analysis process of the circuit starts where a net is selected from the netlist. Although the analysis can proceed with selecting any net from the netlist, in the following description the first net is selected, "unnamed_net4", for convenience. Once a net is selected, it is scanned for the "nodes" which lie on it. The nodes refer to component pins that are connected together directly through a wire or trace. In the illustrative case of FIG. 4, one node constitutes component "U1" pin 4 and the second node constitutes component "R2" pin 1.

Since many electronic designs use series termination resistors, the process looks on the other "side" of component "R2" to determine if the circuit continues or terminates at a power rail or ground. That is, the process determines the mating pin from the parametric model of R2 and determines if it is in a net with other components. Using the component model for "R2" it is possible to see that the mating pin for pin 1 of "R2" is pin 2.

By doing a quick search of the netlist it can be determined that pin 2 of "R2" is a node on the net named "unnamed_net3". Checking the other nodes on that net it can be determined that pin 4 of "U4" is a member of the net. In this example all the nodes for the extended net have been determined. This would repeat until all the nodes for the extended net have been determined.

In the case noted above the extended net will have 4 nodes. These are U1 pin 4, R2 pin 1, R2 pin 2 and U4 pin 4. Using this information the next operation would be to determine the type of nodes that are on the extended net.

In the above example it can be determined from Table 1 that U1 is an ABC123 component. By looking at the parametric model associated with the ABC123 component, which is given in Table 2 above, it can be determined that pin 4 is an active output type, R1 pins 1 and 2 are passive resistor types and again using the bill of material it can be determined that U4 is a XYZ789. Now looking at component XYZ789 it can be determined that pin 4 is an active input type.

At this point it would be possible to perform an enhanced "Design Rules Check" or DRC whereby the complete extended net could be compared to standardized logic rules. An example of a simple DRC would be checking whether there is more than one output per extended net.

The next step would be applying appropriate checks as determined based on the pin types. In this simple example, the checks involve comparing the parameters of the active nodes to see if they are a good match. For example, a check may comprise checking if the output power supplying a component falls within the allowable range of the component. In more complex circuits other checks may be applied. In this example, from the component parametric model for the active output node, component ABC123 pin 4, it is determined that there are 2 sets of parameters specifying operating characteristics. Each set of parameters is specific to a specific supply voltage. In order to select the appropriate set of parameters for this output the supply voltage used for this driver needs to be determined and compared to the pin "Driver Qualifier" in Table 2. This is done by retrieving the appropriate power supply pin for the output driver from the "Driver Power Rail" column for the pin and then looking for that pin in the "Pin Name" of the component model which in this example is pin 2. Then, by using the netlist, the net which that particular power pin is attached to is determined. In the case of the example U1-2 is attached to the net named +2.5V.

A search of the nodes on the +2.5V net shows that 2 active devices U1 pin 2 and U5 pin 3 are connected to it. By looking at Table 1 it is determined that U1 is component ABC123 and from Table 2 that pin 2 is a PWR type pin. A check of U5 using Tables 1 and 5 shows that the component LDO1225 pin 3 is of the type PWROUT. The maximum and minimum supply output voltages are then extracted from Table 5 and used in the next step.

This supply information is then compared to the two pin qualifiers from component ABC123 pin 4 above. The pin parameter that is closest gets chosen as the parameters to use in the next phase. For the other active node, component XYZ789 pin 4, there is only one set of pin parameters so they are the ones used for the next phase.

Passive components that are involved in the circuit tend to be either lower in value if they are in series, as in the example above, or higher in value, if used as a pull up or down, and therefore affect the test in a negligible fashion so can be ignored for the purpose of this threshold analysis.

At this point there is enough data collected to start the next phase. By looking at the extended net the output driver, component ABC123 pin 4, there are four pieces of data that are compared to the input driver, component XYZ789 pin 4. These comparisons are the Vout Max to the Vin Max, the Voh to the Vih, the Vol to the Vil and the Vout Min to the Vin Min. In the example case component ABC123's pin 4 output parameters are Vout Max=2.5V+3%=2.575V, Voh=2V, Vol=0.4V, and Vout Min=0V. Looking at component XYZ789 however it is determined that its pin 4 input parameters are based upon the receiver's supply voltage, VDD18. Looking at the component's model it can be determined that VDD18 power is provided by pin 1. By again searching through the netlist it is determined that the net connected to that pin is +1.8V.

A search of the nodes on the +1.8V net shows that 2 active devices U4 pin 1 and U6 pin 3 are connected to it. By looking at Table 1 it is determined that U4 is component XYZ789, and using Table that pin 1 is a PWR type pin. A check of U6 using Tables 1 and 6 shows that the component LDO1218 pin 3 is of the type PWROUT. The maximum (1.854V) and minimum (1.746V) supply output voltages are then extracted from Table 6 and used in the next step.

This would make XYZ789's input parameters be Vin Max=1.746V, Vih=0.7*1.746V=1.2, Vil=0.3*1.746V=0.52V, and Vin Min=0V. Now the comparisons can be made correctly taking into consideration power supply tolerance. In this example the Vout Max for ABC123 (2.575V) is much greater than XYZ789's Vin Max (1.746V). On comparing the Voh (2V) to the Vih (1.2V), it is noted that this threshold would likely be acceptable. The Vol (0.4V) when compared to the Vil (0.52V) again shows that the threshold would be acceptable. Given that the Vout Min (0V) and the Vin Min (0V) are the same there would be no problems.

At this point a method to intelligently analyze the resultant circuit discrepancies, or rather the results of the checks performed on the circuit board, is required as many of the parameters described in the component parametric model are describing the measured limits of the driver or receiver under the worst conditions. As such, small discrepancies are not as serious as larger ones and cases where the number of nodes on a net is high are worse discrepancies than in situations where there are only two nodes. Further, different checks may be associated with more important checks. For example, some checks, if failed may mean the circuit may not function under certain conditions, while another failed check may mean the circuit would severely damage the circuit. A convenient method is to classify the discrepancies in 2 or 3 categories based upon criterion such as the amount of effort to fix them or the danger level they could present. Other possible criterion could be based upon the likelihood of long term stress induced into the components due to the loading or operational voltage at which they must operate. In the example shown above where the Vout Max for ABC123's output (2.575V) is much greater than XYZ789's Vin Max (1.746V), the large difference in voltage (2.575V−1.746V=0.829V) would probably categorize this discrepancy in the Critical category as this level of discrepancy is 47% (0.829V/1.746V*100%) beyond the input tolerance of the XYZ789's input pin. This would require a larger corrective response by the designer in the form of a design change than say a difference of 3% which, while still beyond the input tolerance might be avoidable by specifying better power supply tolerances as a solution. Each discrepancy classification would require the weighting of several pieces of information such as the net loading (number of nodes on the net), the percentage of parameter "errorness" as well as the technology type. This classification system could be handled very cleanly using the "Fuzzy Logic" method of Artificial Intelligence. The results of the validation testing may then be displayed in various manners as will be readily apparent to one skilled in the art.

The above example has described the validation of a simple circuit definition. It will be appreciated that the process can readily be applied to large circuits having hundred, thousands or more components and connections. By identifying problems in the design of a circuit from the circuit definition, it is possible to correct the problems prior to laying out the physical implementation, which may be costly to change.

Figure 5:
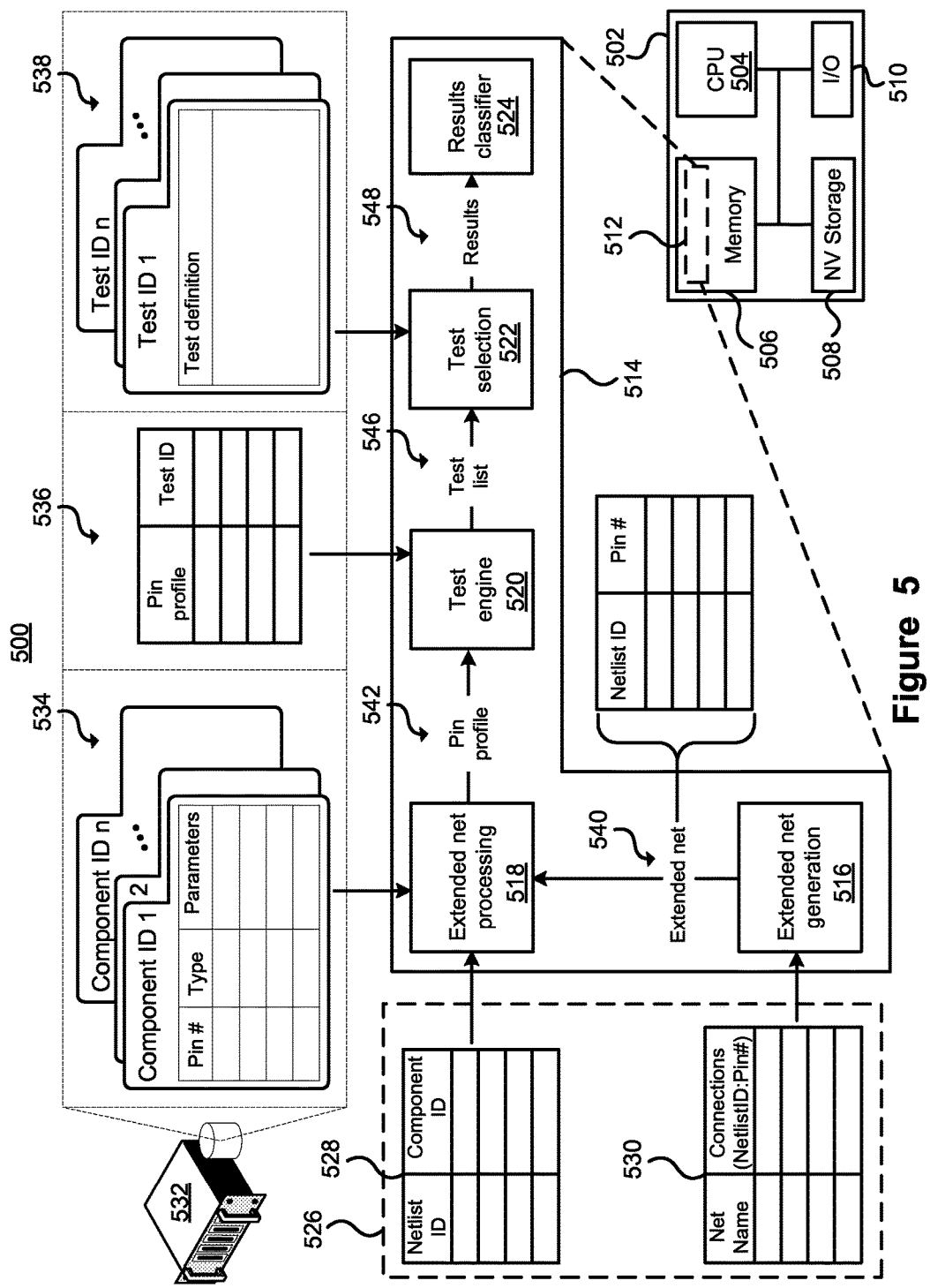
FIG. 5 depicts a further system that may be used to provide the circuit validation functionality.

FIG. 5 depicts a further system that may be used to provide the circuit validation functionality described above. The system 500 may be provided by one or more computing devices. As depicted, a computing device 502 comprises a central processing unit (CPU) 504 that is connected to a memory 506 for storing instructions for execution by the CPU 504. The memory 506 may be volatile memory, such as random access memory (RAM). In addition to the memory 506, the computing device 502 may further comprise non-volatile storage 508. The non-volatile (NV) storage 508 provides long term storage of data and instructions as well as generally providing greater amount of storage space. Data and instructions may be stored in the NV storage 508 and transferred to the memory 506 for access by the CPU 504. The CPU 504 may also be connected to one or more input/output (I/O) components 510. The I/O component allows the computing device to interact with the exterior environment. For Example, the I/O component 510 may be used to connect a keyboard and mouse, or other input component, to the computing device 502 as well as a display, or other output component. The memory 512 may store data and instructions 512 that when executed by the CPU 504 configure the computing device 502 to provide circuit validation functionality 514 as described further below.

The circuit validation functionality 514 is described below as being provided by a plurality of separate components. It will be appreciated that the circuit validation functionality could be provided in a variety of different ways. For example, the functionality described as being provided by a single component may be provided by a plurality of components. Alternatively, the functionality provided by two or more components may be combined together in a single component. For the purpose of explanation, the circuit validation functionality 514 is described as being provided by an extended net generation component 516, an extended net processing component 518, a test selection component 520, a test engine component 522 and a results classification component 524.

The circuit validation functionality 514 receives and processes a circuit definition 526, which includes a BOM 528 or other means for providing component identifiers (ID) used in the circuit and a netlist 530 or other means for providing connections between pins of the circuit components. The BOM 528 is depicted as a table that associates a netlist ID with a component ID. The netlist ID is used to identify components in the netlist and the associated component ID identifies the actual component that the netlist ID represents. The netlist 530 is depicted as a table that associates a net name with a list of connections. The net name may be any name that uniquely identifies the particular net. The list of connections specifies all of the pins of components that are connected together. The connected pins may be specified as a list of netlistIDs:Pin#s that are connected together.

The circuit validation functionality 514 accesses data from a database component 532 or other storage component. The database component 532 may be provided by the computing device 502 or other computing device. The database component 532 is depicted as storing parametric models of components 534, each of which are identified by a component ID that can be used in the BOM 528. Each of the parametric models specifies a pin #, associated pin type, the operating parameters for the pin and optionally a pin name. The database component 532 is depicted as further storing test selection information 536 that may associate a pin profile of an extended net with a test ID. The test ID may be used to identify a particular test from a plurality of tests 538. Each of the tests may provide a test definition which defines one or more checks to perform. Although depicted as being stored in a database component, the tests, or checks, as well as their selection criteria may be provided in various ways, including being hard-coded into the validation functionality, being stored in a file or a table.

The extended net generation component 516 receives the netlist 530 and processes it to generate extended nets 540. The extended nets are the combination of nets that are connected together by passive components. As depicted, an extended net describes all of component pins that are connected together. The connected pins may be specified as the netlistIDs:Pin#s. The extended nets may then be received and processed by the extended net processing component 518. The extended net processing component 518 receives the extended nets, either individually or as a collection of extended nets, and generates a pin profile 542 of the types of pins, and their numbers, in the extended net. The extended net processing component 518 may utilize the BOM component 528 for determining a component ID for the netlist IDs of the circuit components. The component IDs may then be used to retrieve the parametric models of the components and determine the pin types of the pins in the extended nets.

The test selection component 520 receives the pin profile 542 and determines a test list 546. The test list 546 may be determined from the test selection information 536, which associates a pin profile with one or more test IDs. The test selection component 520 may select the pin profile from the test selection information that is the closest to the received pin selection. Alternatively, the pin profile 542 may be used to select one or more test bins that are associated with one or more tests or checks. Further still, the individual pin types present on an extended net may be used to determine tests to apply as well as the composition of the pin types of the extended net.

The test engine component 522 receives the test list 546 which may specify one or more test to apply by a test ID. The test engine component 522 retrieves the tests from the plurality of test 538 based on the test IDs and executes the tests or checks to generate test results 548. Although the test engine has been described as executing the tests as a separate process from the test selection, it is contemplated that the test execution may be incorporated into the selection of the tests or checks. The results 548 are then received by the result classifier 524, which processes the results 548 to provide the results to in format suitable for presentation and interpretation by a user.

As described above, the pin types present on an extended net determines checks to apply to the net. The different checks may check different characteristics of the net. For example, one check may check to see if all of the pins on a net are input pins, since there should likely be at least one driver for the inputs. Similarly, another check may be to check if there are multiple outputs on a single net, as there should likely only be a single driving output. Further checks may include pin function compatibility tests, checks for power/ground/open collector/drain shorts, checks to locate redundant resistors on a net, open collector/drain verification, checking for pull-up/pull-down resistors, component power checks, power/ground plane connection verification, checks for sufficient capacitor decoupling, checks for multiple or missing power supplies on a net, bus flip errors (MSB to LSB connected correctly, Tx and Rx connection errors), checks for overloaded pins.

Further checks can be applied, either to the pins of a net, or to the components of the circuit design. For example, the components of a circuit may be checked to ensure that there are no mandatory pins that are not connected. Further, the names of the pins used in the circuit definition may be used to check for consistency errors with a datasheet of the component. For example, pin 1 of a component may be referred to a Tx1 in the circuit design, which would imply that this is a transmit pin. However if the datasheet, or rather the parametric model, of the component indicates that pin 1 is in fact a receiver pin, this may be an error.

The functionality of the components 516, 518, 520, 522, 524 may be provided in various means. Illustrative steps performed by the individual components are described with regards to FIGS. 6 to 10.

Figure 6:
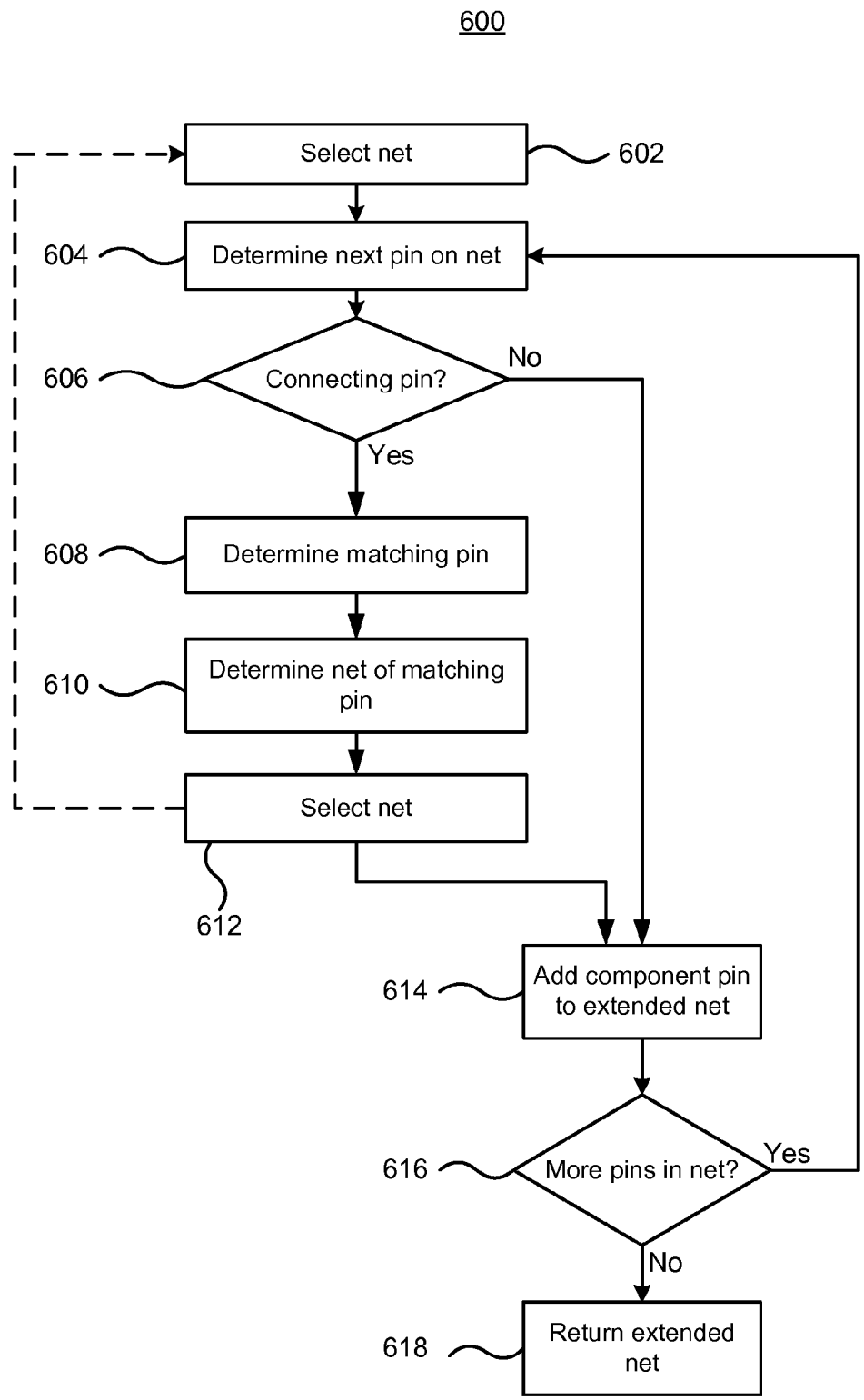
FIG. 6 depicts a method that may be performed by an extended net generation component.

FIG. 6 depicts a method that may be performed by the extended net generation component. The method 600 begins with selecting a net (602) from the received netlist 530. Once a net is selected for processing, the method determines a next pin on the net (604). If no pin has been selected yet, the method may determine the first pin of the net. Once a pin is determined, the method determines if the pin is a connecting pin (606). If the pin is not a connecting pin (No at 606) the component pin is added to the extended net (614) and then it is determined if there are more pins in the net (616). If there are more pins in the net (Yes at 606), the method returns to determine the next pin on the net (604). If there are no more pins in the net, the method returns the extended net, which is a list of component pins. Returning to the determination of whether or not the pin is a connecting pin, if the pin is a connecting pin (Yes at 606), the method determines the matching pin (608) from the parametric model of the component. Once the matching pin is known, the net that the matching pin is in is determined (610) and the net selected (612) for further processing. The processing of the net may be done in a recursive manner, indicated by the dotted line in FIG. 6. Once the recursive processing of the selected net is finished, the method returns the extended net and processing returns to where the recursion began at the net selection (612). The returned extended net, which comprises the list of pins connected to the 'other side' of the matching pin, is added to the extended net (614) and the method 600 continues as described above.

Figure 7:
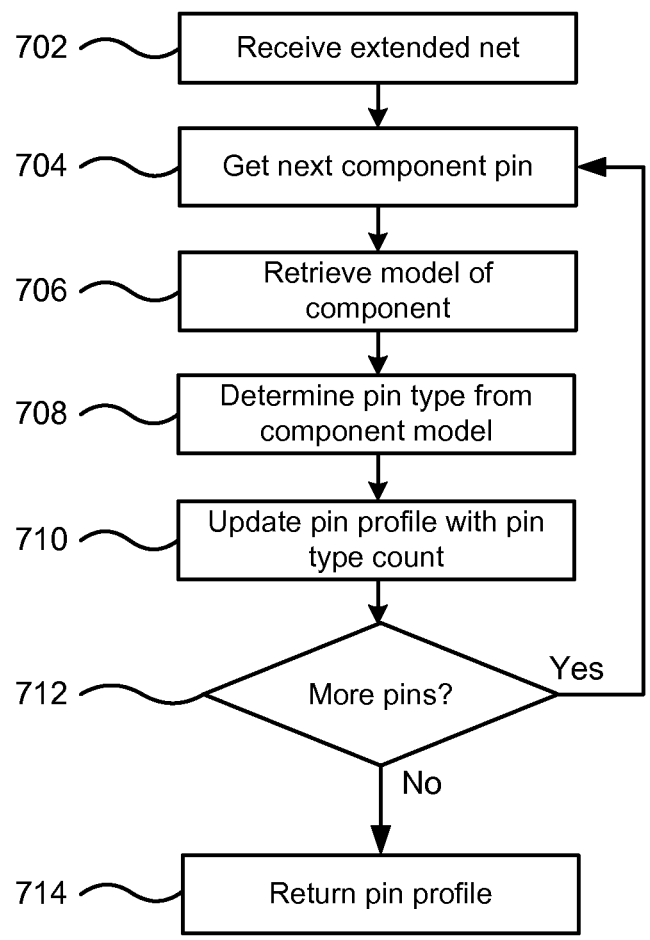
FIG. 7 depicts a method that may be performed by an extended net processing component.

FIG. 7 depicts a method that may be performed by the extended net processing component. The method 700 begins with receiving the extended net (702) and then gets the next component pin from the extended net list (704). The parametric model of the component of the component pin is retrieved (706). The method determines the pin type of the pin from the parametric model (708) and updates a pin profile with the pin type (710). The pin profile may provide a count of the number of pins of each type present in the extended net, or may simply provide an indication that at least one of the pin types is present in the net or extended net. Once the pin profile is updated, the method determines if there are more pins (712) and if there are (Yes at 712) it returns to get the next one (704). If there are no more pins (No at 712), the method returns the pin profile (714).

Figure 8:
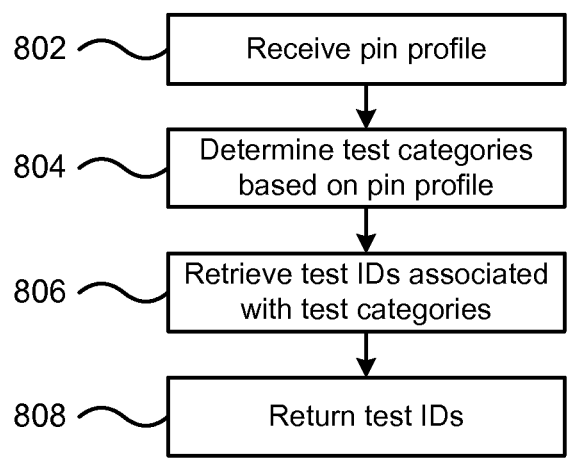
FIG. 8 depicts a method that may be performed by a test selection component.

FIG. 8 depicts a method that may be performed by the test selection component. The method 800 receives the pin profile (802) and determines test categories based on the pin profile (804). The method retrieves test IDs associated with the determined test categories (806) and returns the test IDs (808).

The above described the process of selecting the checks to apply as first generating a pin profile, then determining one or more test categories associated with a corresponding, or similar, pin profile, and then determining tests associated with the tests categories. Alternatively, the tests may be selected as the extended net is being processed. Each pin type may be associated with one or more tests or checks, and when the extended net processing determines the pin type of a pin, it may determine the tests or checks associated with the pin types and they may then be added to a test list for the net or extended net.

Figure 9:
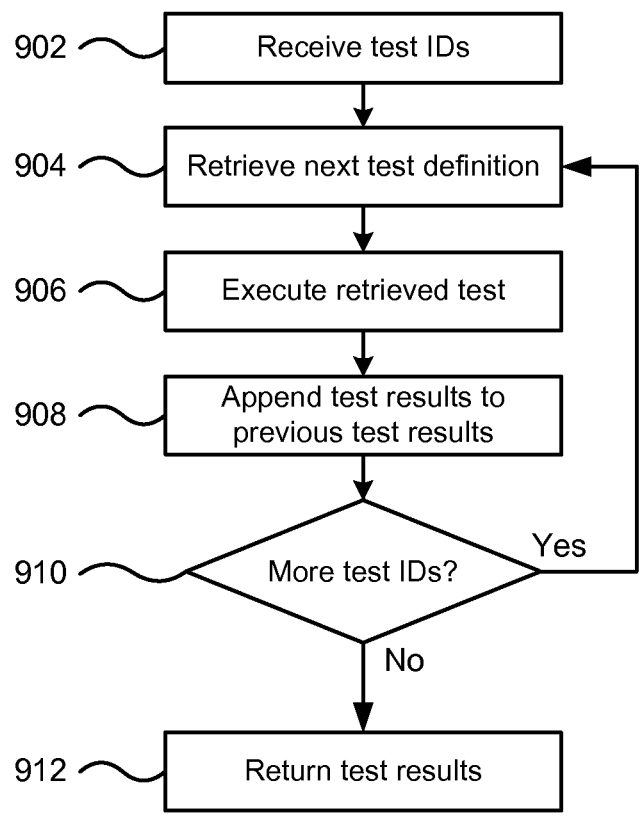
FIG. 9 depicts a method that may be performed by a test engine component.

FIG. 9 depicts a method that may be performed by the test engine component 522. The method 900 receives the test IDs (902) and retrieves the next test definition (904) and then executes the retrieved test (906). The method appends the test results to the previous test results, if any (908). The method determines if there are more test IDs to execute (910) and if there are (Yes at 910) retrieves the next test definition (904). If there are no more tests (No at 910) the test results are returned (912).

Figure 10:
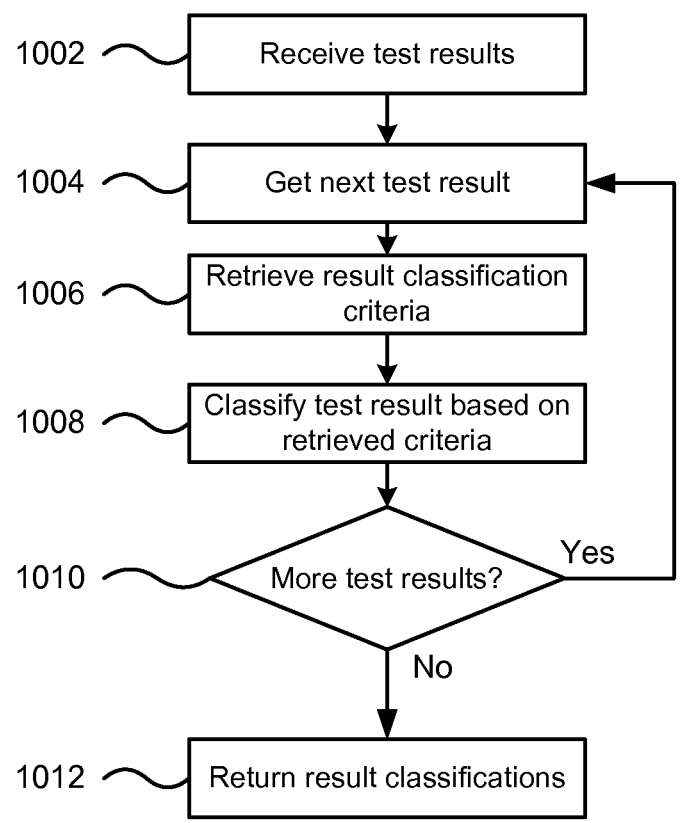
FIG. 10 depicts a method that may be performed by the results classifying component.

FIG. 10 depicts a method that may be performed by the results classifying component. The method 1000 receives the test results (1002), which may include a test IDs associated with the individual test results. The method 1000 gets the next, or the first if the first time, test results (1004). The method 1000 retrieves result classification criteria associated with the individual test (1006). The method 1000 classifies the test results based on the retrieved criteria (1008) and then determines if there are more test results (1010). If there are more test results (Yes at 1010) the method 1000 returns to get the next test result (1004). If there are no more test results (No at 1010), the method returns the result classifications (1012). The classified results that are returned can be displayed to a user and provide an indication of the different problems in the circuit being validated.

The systems and methods described above provide the ability to validate a circuit definition. The system and methods described herein have been described with reference to various examples. It will be appreciated that components from the various examples may be combined together, or components of the examples removed or modified. As described the system may be implemented in one or more hardware components including a processing unit and a memory unit that are configured to provide the functionality as described herein. Furthermore, a computer readable memory, such as for example electronic memory devices, magnetic memory devices and/or optical memory devices, may store computer readable instructions for configuring one or more hardware components to provide the functionality described herein.

What is claimed is:

1. A method for use in validating a circuit design, the method implemented in a computing device comprising:
    accessing by the computing device circuit information specifying a plurality of connections between a plurality of components of at least a portion of the circuit design;
    retrieving at the computing device from a plurality of parametric models a respective parametric model for each of the plurality of components specified in the accessed circuit information, each of the parametric models specifying a pin type, from a plurality of pin types, and operating parameters of each pin of the associated component;
    determining at the computing device a plurality of checks to apply to at least the portion of the circuit design based on the pin types of the plurality of components, wherein each of the plurality checks, when applied to at least the portion of the circuit design, determines one or more characteristics of at least the portion of the circuit design;
    applying at the computing device the plurality of determined checks to at least the portion of the circuit design to identify potential errors resulting from interconnections between components of the portion of the circuit design;
    generating at the computing device test results for at least the portion of the circuit design from the applied plurality of determined checks; and
    displaying the generated test results.

2. The method of claim 1, wherein the plurality of pin types are a predefined set of pin types.

3. The method of claim 1, wherein the circuit information comprises a netlist comprising a plurality of nets specifying the plurality of connections between a plurality of component references and a Bill Of Material (BOM) associating each of the plurality of component references with a respective component.

4. The method of claim 3, wherein determining the plurality of checks to apply comprises determining checks to apply to each net of the netlist.

5. The method of claim 3, wherein determining the plurality of checks to apply comprises:
    determining extended nets for each net in the netlist; and
    determining checks to apply to each of the determined extended nets.

6. The method of claim 5, wherein determining checks to apply to each of the determined extended nets comprises:
    determining a composition of pin types in the respective extended net; and
    selecting a subset of checks from a plurality of checks based on the pin type composition of the extended net.

7. The method of claim 1, wherein one or more of the plurality parametric models comprises a plurality of operating parameters for a pin of the associated component, each associated with a selecting condition for selecting its use with the component, the method further comprising:
    determining one of the operating parameters of the pin to use based on the selecting condition.

8. The method of claim 7, wherein the selecting condition specifies an operating parameter of another pin of the associated component, and determining one of the operating parameters comprises determining the operating parameter of the other pin based on one or more connected components.

9. The method of claim 7, wherein the selecting condition is associated with a parameter of the associated component.

10. The method of claim 7, wherein the selecting condition specifies a characteristic value of the associated component.

11. The method of claim 7, wherein the selecting condition is based on an operating characteristic of the associated component.

12. The method of claim 1, wherein accessing the circuit information comprises receiving the circuit information from a circuit design tool.

13. The method of claim 12, wherein the portion of the circuit design comprises a net in the circuit that was modified by the circuit design tool.

14. The method of claim 13, wherein displaying the generated test results comprises displaying the generated test results in the circuit design tool.

15. The method of claim 1, wherein each of the parametric models specify one or more of:
    a pin number;
    a pin name;
    the pin type;
    a maximum input voltage;
    a minimum input voltage;
    an input voltage representing a logic level high;
    an input voltage representing a logic level low;
    a maximum output voltage;
    a minimum output voltage;
    an output voltage representing a logic level high;
    an output voltage representing a logic level low;
    a driver qualifier specifying a voltage for selecting one of a plurality of operating parameters for a pin;
    a driver power rail specifying a pin associated with the driver qualifier;
    a maximum supply voltage; and
    a minimum supply voltage.

16. A system for validating a circuit design comprising:
    a processor for executing instructions; and
    a memory for storing instructions, the instructions when executed by the processor configuring the system to:
        access circuit information specifying a plurality of connections between a plurality of components of at least a portion of the circuit design;
        retrieve from a plurality of parametric models a respective parametric model for each of the plurality of components specified in the accessed circuit information, each of the parametric models specifying a pin type, from a plurality of pin types, and operating parameters of each pin of the associated component;
        determine a plurality of checks to apply to at least the portion of the circuit design based on the pin types of the plurality of components, wherein each of the plurality checks, when applied to at least the portion of the circuit design, determines one or more characteristics of at least the portion of the circuit design;

apply the plurality of determined checks to at least the portion of the circuit design to identify potential errors resulting from interconnections between components of the portion of the circuit design;

generate test results for at least the portion of the circuit design from the applied plurality of determined checks; and display the generated test results.

17. The system of claim 16, wherein the plurality of pin types are a predefined set of pin types.

18. The system of claim 16, wherein the circuit information comprises a netlist comprising a plurality of nets specifying the plurality of connections between a plurality of component references and a Bill Of Material (BOM) associating each of the plurality of component references with a respective component.

19. The system of claim 18, wherein configuring the system to determine the plurality of checks to apply comprises configuring the system to determine checks to apply to each net of the netlist.

20. The system of claim 18, wherein configuring the system to determine the plurality of checks to apply comprises configuring the system to:
determine extended nets for each net in the netlist; and
determine checks to apply to each of the determined extended nets.

21. The system of claim 20, wherein configuring the system to determine checks to apply to each of the determined extended nets comprises configuring the system to:
determine a composition of pin types in the respective extended net; and
select a subset of checks from a plurality of checks based on the pin type composition of the extended net.

22. The system of claim 16, wherein one or more of the plurality parametric models comprises a plurality of operating parameters for a pin of the associated component, each associated with a selecting condition for selecting its use with the component, the instructions further configuring the system to:
determine one of the operating parameters of the pin to use based on the selecting condition.

23. The system of claim 22, wherein the selecting condition specifies an operating parameter of another pin of the associated component, and configuring the system to determine one of the operating parameters comprises configuring the system to determine the operating parameter of the other pin based on one or more connected components.

24. The system of claim 22, wherein the selecting condition is associated with a parameter of the associated component.

25. The system of claim 22, wherein the selecting condition specifies a characteristic value of the associated component.

26. The method of claim 22, wherein the selecting condition is based on an operating characteristic of the associated component.

27. The system of claim 16, wherein configuring the system to access the circuit information comprises configuring the system to receive the circuit information from a circuit design tool.

28. The system of claim 27, wherein the portion of the circuit design comprises a net in the circuit that was modified by the circuit design tool.

29. The system of claim 28, wherein the instructions further configure the system to display the results in the circuit design tool.

30. The system of claim 16, wherein each of the parametric models specify one or more of:
a pin number;
a pin name;
the pin type;
a maximum input voltage;
a minimum input voltage;
an input voltage representing a logic level high;
an input voltage representing a logic level low;
a maximum output voltage;
a minimum output voltage;
an output voltage representing a logic level high;
an output voltage representing a logic level low;
a driver qualifier specifying a voltage for selecting one of a plurality of operating parameters for a pin;
a driver power rail specifying a pin associated with the driver qualifier;
a maximum supply voltage; and
a minimum supply voltage.

31. A non-transitory computer readable memory containing instructions for carrying out at a computing device a method for use in validating a circuit design, the method comprising:
accessing by the computing device circuit information specifying a plurality of connections between a plurality of components of at least a portion of the circuit design;
retrieving at the computing device from a plurality of parametric models a respective parametric model for each of the plurality of components specified in the accessed circuit information, each of the parametric models specifying a pin type, from a plurality of pin types, and operating parameters of each pin of the associated component;
determining at the computing device a plurality of checks to apply to at least the portion of the circuit design based on the pin types of the plurality of components, wherein each of the plurality checks, when applied to at least the portion of the circuit design, determines one or more characteristics of at least the portion of the circuit design; applying at the computing device the plurality of determined checks to at least the portion of the circuit design to identify potential errors resulting from interconnections between components of the portion of the circuit design;
generating at the computing device test results for at least the portion of the circuit design from the applied plurality of determined checks; and
displaying the generated test results.

* * * * *